(12) United States Patent
Butler et al.

(10) Patent No.: US 11,609,503 B2
(45) Date of Patent: *Mar. 21, 2023

(54) LITHOGRAPHIC APPARATUS

(71) Applicant: ASML NETHERLANDS B.V., Veldhoven (NL)

(72) Inventors: Hans Butler, Best (NL); Engelbertus Antonius Fransiscus Van Der Pasch, Oirschot (NL); Paul Corné Henri De Wit, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/218,420

(22) Filed: Mar. 31, 2021

(65) Prior Publication Data
US 2021/0223703 A1 Jul. 22, 2021

Related U.S. Application Data (63) Continuation of application No. 16/774,035, filed on Jan. 28, 2020, now Pat. No. 10,976,675, which is a (Continued)

(30) Foreign Application Priority Data

May 25, 2016 (EP) .................... 16171338

(51) Int. Cl.
*G03F 7/20* (2006.01)
*G03F 9/00* (2006.01)

(52) U.S. Cl.
CPC ........ *G03F 7/7085* (2013.01); *G03F 7/70716* (2013.01); *G03F 7/70725* (2013.01);
(Continued)

(58) Field of Classification Search
CPC ............. G03F 7/70633; G03F 7/70725; G03F 7/70775; G03F 7/7085; G03F 9/70;
(Continued)

(56) References Cited

U.S. PATENT DOCUMENTS 4,952,060 A 8/1990 Ina et al.
5,646,413 A 7/1997 Nishi
(Continued)

FOREIGN PATENT DOCUMENTS

CN 103365095 10/2013
CN 104035287 9/2014
(Continued)

OTHER PUBLICATIONS

International Search Report and Written Opinion issued in corresponding PCT Patent Application No. PCT/EP2017/059383, dated Aug. 7, 2017.
(Continued)

*Primary Examiner* — Hung V Nguyen
(74) *Attorney, Agent, or Firm* — Pillsbury Winthrop Shaw Pittman LLP (57) ABSTRACT

A lithographic apparatus having a substrate table, a projection system, an encoder system, a measurement frame and a measurement system. The substrate table has a holding surface for holding a substrate. The projection system is for projecting an image on the substrate. The encoder system is for providing a signal representative of a position of the substrate table. The measurement system is for measuring a property of the lithographic apparatus. The holding surface is along a plane. The projection system is at a first side of the plane. The measurement frame is arranged to support at least part of the encoder system and at least part of the measurement system at a second side of the plane different from the first side.

20 Claims, 4 Drawing Sheets

Related U.S. Application Data continuation of application No. 16/547,933, filed on Aug. 22, 2019, now Pat. No. 10,571,815, which is a continuation of application No. 16/099,733, filed as application No. PCT/EP2017/059383 on Apr. 20, 2017, now Pat. No. 10,466,599.

(52) U.S. Cl.
CPC ...... *G03F 7/70775* (2013.01); *G03F 7/70808* (2013.01); *G03F 9/70* (2013.01); *G03F 9/7015* (2013.01); *G03F 9/7019* (2013.01); *G03F 9/7049* (2013.01); *G03F 9/7084* (2013.01); *G03F 9/7088* (2013.01); *G03F 7/70633* (2013.01)

(58) Field of Classification Search
CPC .... G03F 9/7015; G03F 9/7019; G03F 9/7049; G03F 7/7084; G03F 7/7088
See application file for complete search history.

(56) References Cited

U.S. PATENT DOCUMENTS

| | | | |
|---|---|---|---|
| 8,570,492 B2 * | 10/2013 | Van Der Pasch ... | G03F 7/70725 355/72 |
| 9,696,638 B2 * | 7/2017 | Van Der Pasch ... | G03F 7/70725 |
| 10,466,599 B2 * | 11/2019 | Butler ................. | G03F 7/70716 |
| 2006/0082904 A1 | 4/2006 | Kato et al. | |
| 2007/0291245 A1 | 12/2007 | Der Sijs et al. | |
| 2008/0088843 A1 | 4/2008 | Shibazaki | |
| 2009/0059194 A1 | 3/2009 | Kanaya | |
| 2010/0081095 A1 | 4/2010 | Shibazaki | |
| 2010/0159403 A1 | 6/2010 | Shibazaki | |
| 2011/0008734 A1 | 1/2011 | Ichinose | |
| 2011/0058731 A1 | 3/2011 | Crespin et al. | |
| 2012/0242969 A1 | 9/2012 | Van Der Pasch et al. | |
| 2013/0177857 A1 | 7/2013 | Shibazaki | |
| 2014/0132940 A1 | 5/2014 | Yoda | |
| 2014/0253897 A1 | 9/2014 | Liu et al. | |
| 2017/0108716 A1 | 4/2017 | Shirato | |
| 2019/0187566 A1 | 6/2019 | Butler et al. | |

FOREIGN PATENT DOCUMENTS

| | | |
|---|---|---|
| EP | 1670043 A2 | 6/2006 |
| JP | S6324618 | 2/1988 |
| JP | 2012191205 | 10/2012 |
| JP | 2012531028 | 12/2012 |
| JP | 2015043390 | 3/2015 |
| TW | 201035692 | 10/2010 |
| TW | 201106114 | 2/2011 |
| TW | 201618162 | 5/2016 |
| WO | 2010147245 | 12/2010 |

OTHER PUBLICATIONS

Japanese Office Action issued in corresponding Japanese Patent Application No. 2018-555613, dated Nov. 29, 2019.
Japanese Office Action issued in corresponding Japanese Patent Application No. 2018-555613, dated Mar. 4, 2020.
Chinese Office Action issued in corresponding Chinese Patent Application No. 2017800323090, dated Mar. 4, 2020.
Taiwanese Office Action issued in corresponding Taiwanese Patent Application No. 106117086, dated Apr. 16, 2021.

* cited by examiner

LITHOGRAPHIC APPARATUS

This application is a continuation of U.S. patent application Ser. No. 16/774,035, filed on Jan. 28, 2020, now allowed, which is a continuation of U.S. patent application Ser. No. 16/547,933, filed on Aug. 22, 2019, now U.S. Pat. No. 10,571,815, which is a continuation of U.S. patent application Ser. No. 16/099,733, filed on Nov. 8, 2018, now U.S. Pat. No. 10,466,599, which is the U.S. national phase entry of PCT patent application no. PCT/EP2017/059383, filed on Apr. 20, 2017, which claims the benefit of priority of European patent application no. 16171338.3, filed on May 25, 2016, each of the foregoing applications is incorporated herein in its entirety by reference.

FIELD

The present description relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A known lithographic apparatus is disclosed in U.S. patent application no. US2014/0132940, hereby incorporated by reference. The known lithographic apparatus has a plurality of measurement systems that are needed to expose an image accurately on the substrate W. For example, the known lithographic apparatus has a top side encoder system, a back-side encoder system, an exposure coordinate setting measurement system and an alignment detection system coupled to a main controller to drive the wafer table.

SUMMARY

To accurately position the substrate W relative to the projection system, the plurality of measurement systems need to be coupled to each other, for example coupled to each other via a common reference. However, because some measurement systems of the known lithographic system are above the substrate W, some are below the substrate W and some are substantially in-plane with the substrate W, the measurement systems are not coupled ideally. A shift between some of the plurality of measurement systems may occur, resulting in less accurate positioning of the substrate W.

It is an objective of the invention to provide a lithographic apparatus with an improved measurement system.

According to an aspect of the invention, there is provided a lithographic apparatus comprising:
  a substrate holder having a holding surface for holding a substrate;
  a projection system for projecting an image on the substrate;
  an encoder system for providing a signal representative of a position of the substrate holder;
  a measurement frame;
  a measurement system for measuring a property of the lithographic apparatus,
  wherein the holding surface is along a plane,
  wherein the projection system is at a first side of the plane,
  wherein the measurement frame is arranged to support at least part of the encoder system and at least part of the measurement system at a second side of the plane different from the first side.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
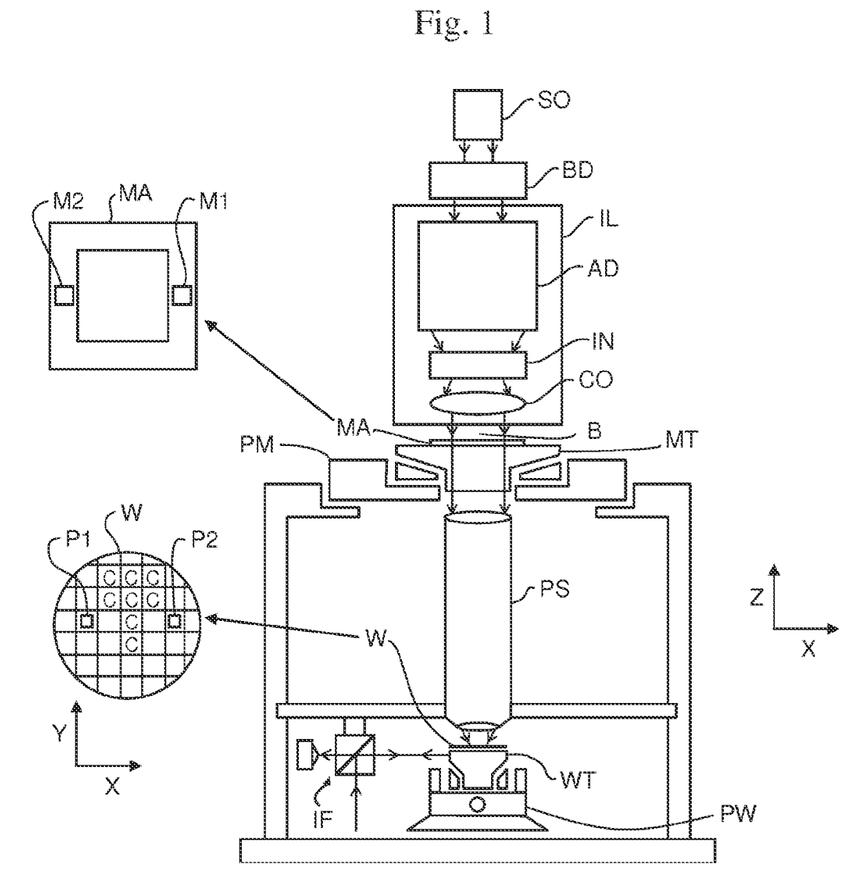
FIG. 1 depicts a lithographic apparatus according to an embodiment of the invention.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

The first positioner PM may comprise a long-stroke module and a short-stroke module. The short-stroke module is arranged to move the support structure MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the support structure MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
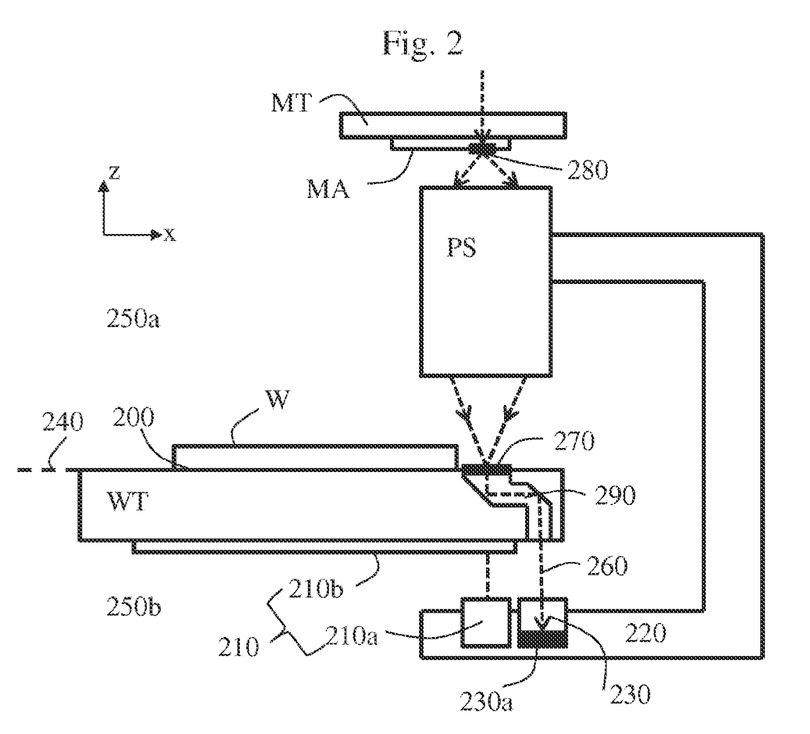
FIG. 2 depicts a first embodiment of the invention.

FIG. 2 depicts a first embodiment of the invention. FIG. 2 depicts the lithographic apparatus comprising the substrate table WT, the projection system PS, an encoder system 210, a measurement frame 220 and a measurement system 230.

The substrate table WT has a holding surface 200 for holding the substrate W. The projection system PS is arranged to project an image on the substrate W. The encoder system 210 is arranged for providing a signal representative of a position of the substrate table WT. The measurement system 230 is arranged for measuring a property of the lithographic apparatus. The holding surface 200 is along a plane 240. The projection system PS is at a first side 250a of the plane 240. The measurement frame 220 is arranged to support at least part of the encoder system 210 and at least part of the measurement system 230 at a second side 250b of the plane 240. The second side 250b is different from the first side 250a.

The holding surface 200 may be at a top surface of the substrate table WT, for example as indicated in FIG. 2. Alternatively, the holding surface 200 may be in a recess of the substrate table WT. The depth of the recess may be substantially the same as the thickness of the substrate W, such that when the substrate W is on the holding surface 200, the top surface of the substrate W is in the same plane as the top surface of the substrate table WT. The holding surface 200 may be a single surface or may comprise multiple surfaces. The holding surface 200 may be formed by the end surfaces of a plurality protrusions extending in a direction from the second side 250b toward the first side 250a. The protrusions may be referred to as pins or burls. The holding surface 200 is along the plane 240, which is in this embodiment in the horizontal xy-plane.

The encoder system 210 comprises an encoder head 210a and a scale 210b. The encoder head 210a is supported by the measurement frame 220. The scale 210b is supported by the substrate table WT. The scale 210b is provided with a grating pattern. The encoder head 210a cooperates with the scale 210b to provide a signal representative of a position of the scale 210b relative to the encoder head 210a. The encoder head 210a may provide a signal representative of a position in one degree of freedom or the encoder head 210a may provide multiple signals representative of positions in multiple degrees of freedom. For example, the encoder head 210a may provide signals for 6 degrees of freedom. The encoder head 210a may provide more than 6 signals needed for 6 degrees of freedom, for example 8 or 10 signals, to provide redundant measurement information. The redundant measurement information may be used to determine a deformation, e.g., a bending, of the substrate table WT. The encoder head 210a may be implemented as a single unit or may be implemented as a plurality of units located near each other. Alternatively, the encoder head 210a is supported by the substrate table WT, and the scale 210b is supported by the measurement frame 220.

The measurement frame 220 is arranged to support the encoder head 210a and the measurement system 230. The measurement frame 220 may comprise a low-expansion material with a coefficient of thermal expansion, CTE, that is lower than for example steel or aluminum. Such a low-expansion material may be Zerodur or Cordirite or Invar. The measurement frame 220 may be connected to or may be part of a reference frame. The reference frame may be arranged to support the projection system PS. A position of the projection system PS may be determined relative to the reference frame.

The projection system PS is at the first side 250a of the plane 240. The measurement frame 220 supports the encoder head 210a and the measurement system 230 at the second side 250b of the plane 240. In this embodiment, the projection system PS is located above the holding surface 200, and the measurement frame 220 supports the encoder head 210a and the measurement system 230 below the support surface 200.

The measurement system 230 may comprise a detector 230a arranged on the measurement frame 220. The detector 230a may be arranged to receive a radiation beam 260. The detector 230a may comprise a camera, for example, to detect an image created by the radiation beam 260.

In the embodiment of FIG. 2, the lithographic apparatus comprises a mark 270. The projection system PS is arranged to provide the radiation beam 260 via the mark 270 onto the detector 230a.

The support structure MT is arranged to support the patterning device MA. The patterning device MA is provided with a patterning mark 280. Alternatively or in addition, the support structure MT is provided with the patterning mark 280. The projection system PS is arranged to project an image based on the patterning mark 280 onto the mark 270. The measurement system 230 may be arranged to determine a position of the mark 270 relative to the patterning mark 280. The position of the mark 270 relative to the patterning mark 280 may be determined by the image that is incident on the detector 230a. The position of the mark 270 relative to the patterning mark 280 may be determined by an interference pattern caused by the mark 270 and the patterning mark 280. For example, the substrate table WT may be moved during use of the measurement system 230 to find a position of the substrate table WT at which the interference pattern causes a maximum intensity on the detector 230a. Alternatively, the support structure MT is moved and/or a position with a minimum intensity is determined.

The property of the lithographic apparatus to be measured with the measurement system 230 may be an image quality of the projection system PS. The projection system PS provides the radiation beam 260 via the mark 270 onto the detector 230a. The image quality may be determined by the image of the mark 270 that is projected onto the detector 230a. The image quality may be determined by an interference pattern that is incident on the detector 230a. The image quality may include an aberration of the projection system PS, and/or an intensity of the radiation beam 260, and/or a distribution of radiation along a cross-section of the radiation beam 260. The image quality may be a position of the focal point of the projection system PS.

In the embodiment of FIG. 2, the mark 270 is arranged on the substrate table WT. The substrate table WT may be provided with an optical system 290. The optical system 290 is arranged to propagate the radiation beam 260 at least partly in a direction along the plane 240. The optical system 290 may be arranged to propagate the radiation beam 260 at least partly in a direction parallel to the plane 240 To have an accurate position measurement of the substrate table WT during the exposure of the substrate W, the encoder head 210a may be arranged along the optical axis of the projection system PS. The projection system PS projects an image along the optical axis. Since the encoder head 210a is located on the measurement frame 220 at the optical axis, there may not be enough space to also provide the measurement system 230 at the optical axis. By providing the optical system 290, the image provided by the projection system PS at the optical axis to directed away from the optical axis. This allows the measurement system 230 to receive the radiation beam 260 away from the optical axis. The optical system 290 may by any type of suitable optical system and may comprise any type of suitable optical components such as mirrors, lenses and/or optical filters. The optical system 290 may comprise fluorescent material to change the wavelength of the radiation beam 260. By changing the wavelength, the detector 230a suitable for radiation other than exposure radiation may be used. The optical system 290 may comprise a polarizer to change the polarization of the radiation beam 260. The optical system 290 may comprise an optical fiber, such as a glass-fiber, to propagate the radiation beam 260. The optical system 290 may also direct the radiation beam 260 in a vertical direction.

Figure 3:
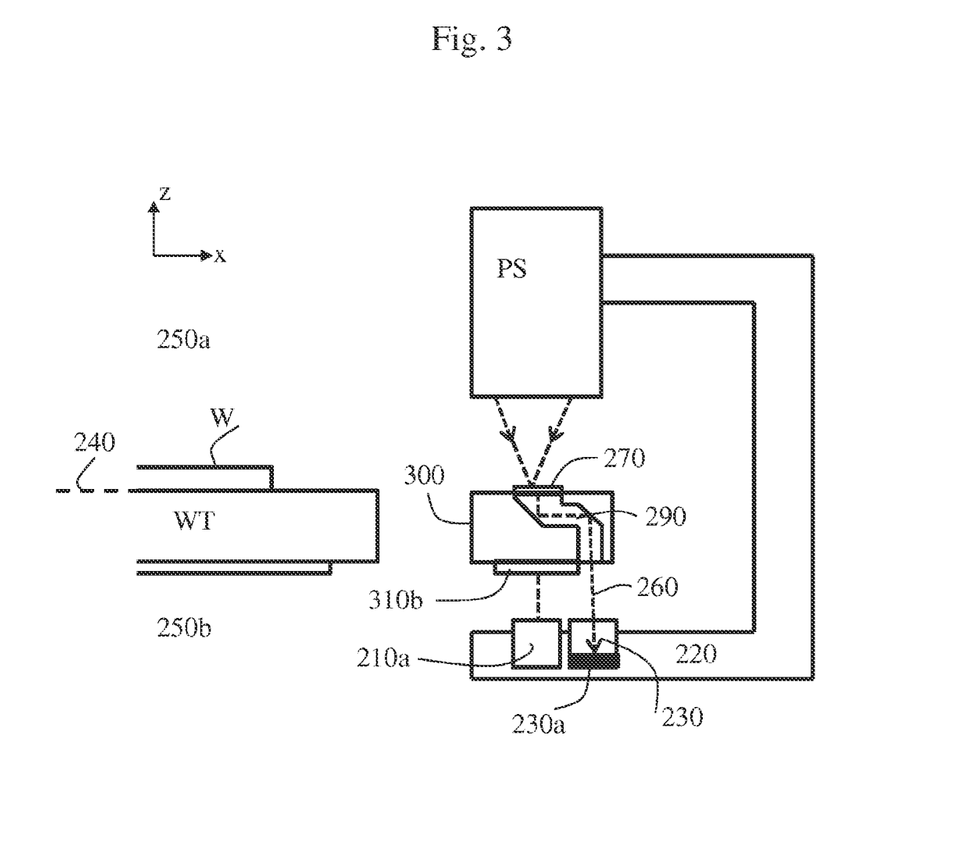
FIG. 3 depicts a second embodiment of the invention.

FIG. 3 depicts a second embodiment of the invention. The same references refer to the same elements of the embodiment of FIG. 2, except for what is stated below. FIG. 3 depicts a further stage 300. The further stage 300 is arranged to be at the projection system PS when the substrate table WT is away from the projection system PS. The mark 270 is arranged on the further stage 300. Whereas the substrate table WT is arranged to hold the substrate W, the further stage 300 may not be arranged to hold the substrate W. Instead, the further stage 300 may be arranged to hold at least one sensor and/or a part of at least one sensor.

As disclosed above, the projection system PS may direct the radiation beam 260 via the mark 270 onto the detector 230a. The further stage 300 may be provided with the optical system 290 or may not be provided with the optical system 290. The further stage 300 may hold a further scale 310b to cooperate with the encoder head 210a, similarly as the scale 210b cooperates with the encoder head 210a. Alternatively, the further stage 300 is not provided with the scale 310b.

Similar to what is described above, the measurement system 230 is arranged to measure a property of the lithographic apparatus, such as a position of the mark 270 on the further stage 300 relative to the detector 230a and/or an image quality of the projection system PS.

In an embodiment, the lithographic apparatus is provided with a liquid supply system to provide the immersion liquid, so as to fill a space between the projection system PS and the substrate W during exposure of the substrate W. When the exposure of the substrate W is completed, a new substrate W is to be loaded onto the substrate table WT. For loading the new substrate W, the substrate table WT is moved away from the projection system PS. To contain the immersion liquid in the space, the further stage 300 replaces the substrate W beneath the projection system, so the liquid fills a space between the projection system PS and the further stage 300.

In an embodiment, the mark 270 is on the substrate table WT, and the optical system 290 is on the further stage 300. The lithographic apparatus is arranged to direct the radiation beam 260 from the projection system PS via the mark 270 on the substrate table WT and via the optical system 290 on the further stage 300 to the detector 230a. For the radiation beam 260 to propagate from the substrate table WT to the further stage 300, the substrate table WT and the further stage 300 may be positioned adjacent to each other, for example the substrate table WT and the further stage 300 are in contact with each other, or the substrate table WT and the further stage 300 are close to each other.

Figure 4:
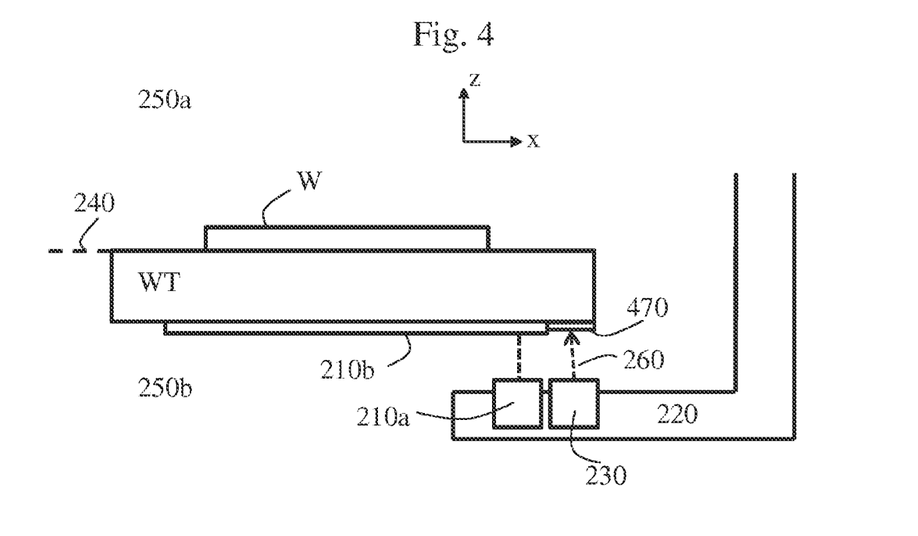
FIG. 4 depicts a third embodiment of the invention.

FIG. 4 depicts a third embodiment of the invention. The same references refer to the same elements of the embodiments of FIGS. 2 and 3, except for what is stated below. The third embodiment has a reference mark 470 for providing a position reference for the encoder system. The detector 230a is arranged to receive the radiation beam 260 via the reference mark.

The encoder system 210 may be an incremental measurement system, which means that the scale 210b has a pattern with plurality of identical periods. Within a period, the encoder system 210 is able to accurately determine a position. However, the encoder system 210 may not be able to determine in which period the measurement takes place. When the detector 230a receives the radiation beam 260 via the reference mark 470, the measurement system 230a may determine an absolute position of the reference mark 470 relative to the detector 230a. The absolute position may be used as a reference or starting position for the encoder system 210 to determine in which period the encoder system 210 is measuring. Since both the encoder head 210*a* and the detector 230*a* are supported by the measurement frame 220, a good position relationship between the encoder head 210*a* and the detector 230*a* may be achieved. The good position relationship may improve the accuracy with which starting position for the encoder system 210 can be determined.

In FIG. 4, the reference mark 470 is depicted as being separate from the scale 210*b*, for example adjacent to the scale 210*b*. In an embodiment, reference mark 470 is arranged on the scale 210*b*. A pattern of the reference mark 470 may be superimposed on the pattern of the scale 210*b*.

Figure 5:
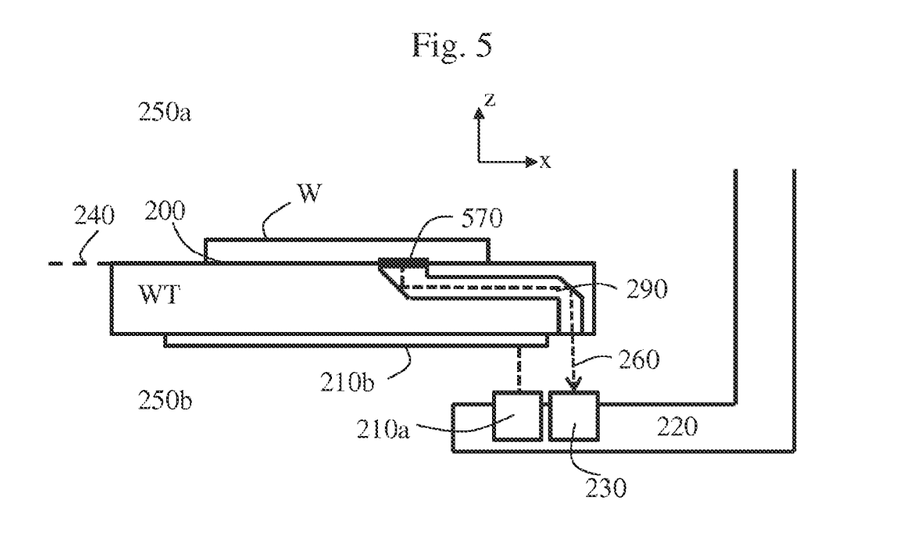
FIG. 5 depicts a fourth embodiment of the invention.

FIG. 5 depicts a fourth embodiment of the invention. The same references refer to the same elements of the embodiments of FIGS. 2, 3 and 4, except for what is stated below. In the embodiment of FIG. 5, the substrate W is provided with a substrate mark 570. The substrate mark 570 is provided on a surface of the substrate W that is in contact with the holding surface 200. The substrate mark 570 is provided on the surface of the substrate W opposite to the surface on which the IC's are to be formed. The detector 230*a* is arranged to receive the radiation beam 260 via the substrate mark 570. The measurement system 230 is arranged to determine a position of the substrate mark 570 relative to a position of the detector 230*a*. In this embodiment, a direct positional relationship between the substrate W and the measurement system 230 can be determined. For example, the position of the substrate mark 570 may act as the reference for the encoder system 210. Having the substrate mark 570 as the reference may have the benefit that in case the substrate W is placed onto the holding surface 200 with an offset in the xy-plane, the offset does not have a negative effect on the exposure process. By using the substrate mark 570 as a reference, the offset may be taken into account and be compensated. Further, having the substrate mark 570 on the surface of the substrate W that contacts the holding surface 200 has the benefit that the substrate mark 570 is less affected by processing the substrate W than a mark arranged on the surface of the substrate W on which the IC's are formed. A mark arranged on the surface of the substrate W on which the IC's are formed may be deformed by etching and deposition of the substrate W, whereas etching and deposition may have a smaller influence on the surface of the substrate W that contacts the holding surface 200.

In the embodiments described above, the measurement system 230 may be provided with a radiation source for providing the radiation beam 260. The radiation source may be arranged on the measurement frame 220. The radiation source may be arranged at the second side 250*b* of the plane 240. The radiation source and the detector 230*a* may be combined in a single unit.

In the embodiments of FIGS. 2 and 3, the radiation source may provide the radiation beam 260 and direct the radiation beam 260 from the radiation source to the projection system PS, from the projection system PS onto the patterning mark 280, and back from the patterning mark 280 to the detector 230*a* via the projection system PS and the mark 270. The patterning mark 280 may be a reflective mark. In the embodiment of FIG. 2, the patterning mark 280 may be a transmissive mark.

In the embodiment of FIG. 4, the radiation source may direct the radiation beam 260 from the radiation source to the reference mark 470. The reference mark 470 may reflect the radiation beam 260 to the detector 230*a*. Alternative, the reference mark 470 is transmissive and a reflective element is provided to direct the radiation beam 260 to the detector 230*a*. In an embodiment, the scale 210*b* may be reflective to reflect the radiation beam 260 to the detector 230*a*.

The lithographic apparatus may comprise a control system for controlling a position of the substrate table WT based on the signal from the encoder system 210 and an output from the measurement system 230. For example, the control system may adjust the position of the substrate table WT as determined by the encoder system 210 to take into account the imaged patterning mark 280 on the mark 270. By adjusting the position of the substrate table WT in this way, the substrate table W may be positioned in such a way that an image of the patterning device MA is projected on the correct position on the substrate W. In another example, the control system may adjust the position of the substrate table WT as determined by the encoder system 210 to take into the image quality of the projection system PS. The measurement system 230 may determine the focal position of the projection system PS. The control system may adjust the position of the substrate table W in such a way that the substrate W is at the focal position in order to have an in-focus image on the substrate W. Alternatively or in addition, the control system may adjust the position, orientation or shape of an optical component in the projection system to adjust the image. For example, the control system may adjust a flexible mirror to adjust the image. The flexible mirror may have a plurality of actuators arranged to deform a reflective surface of the mirror.

The embodiments described above describe that the mark 270, the optical system 290, the scale 210*b* and the reference mark 470 may be connected to the substrate table WT. In an embodiment, one or more of the mark 270, the optical system 290, the scale 210*b* and the reference mark 470 may be connected to the second positioner PW. For example, the substrate table WT and part of the second positioner PW may be implemented as an integrated unit. In another example, the mark 270 is connected to the short-stroke module, whereas the optical system 290 is connected to the long-stroke module.

In the embodiments described above, the measurement system 230 is arranged to cooperate with the mark 270, the patterning mark 280 and/or the reference mark 470. The measurement system 230 may be an optical measurement system. Alternatively, the measurement system 230 may be another type of measurement system. For example, the measurement system 230 may comprise a capacitive sensor or an inductive sensor supported by the measurement frame 220 on the second side 250*b*. The reference mark 470 may comprise a target suitable to cooperate with the capacitive sensor or the inductive sensor, such that the sensor can provide a signal representative of a distance between the sensor and the reference mark 470. Alternatively, the measurement system 230 may comprise an interferometer arranged to determine a distance between the reference mark 470 and the interferometer arranged on the measurement frame 220. The reference mark 470 may comprise a reflective element, such as a mirror, to reflect a measurement beam from the interferometer.

To reduce vibrations of the measurement frame 220, a damper may be provided to damp the measurement frame 220. The damper may be provided near the measurement system 230 to reduce vibrations of the measurement system 230. The damper may be a passive damper, such as a tuned-mass damper, or may be an active damper or may be a combination of an active and a passive damper.

An additional measurement system may be provided to determine a distance or a change in distance between the measurement system 230 and a reference. For example, the reference may be the projection system PS. Due to vibrations or thermal expansion of the measurement frame 220, the distance between the projection system PS and the detector 230*a* may vary. By measuring this distance, the substrate table WT may be positioned relative to the reference, e.g., the projection system PS, more accurately. The additional measurement system may comprise an interferometer system, for example an interferometer system having a measurement beam propagating through the measurement frame 220. The additional measurement system may comprise one or more strain gauges to detect deformation of the measurement frame 220. Based on the detected deformation, a position of the detector 230*a* may be deducted. Instead of the projection system PS, another reference may be used, for example, a reference frame or the support structure MT or the patterning device MA.

The lithographic apparatus may be provided with multiple measurement frames 220. For example, two sides of the lithographic apparatus opposite to each other may each have a measurement frame 220. On one of the two measurement frames 220, the encoder head 210*a* may be arranged at the optical axis of the projection system PS. On the other of the two measurement frames 220, the encoder head 210*a* may be arranged near a measurement device. The measurement device may be an alignment device to determine a position of the substrate alignment marks P1, P2. The measurement device may be a sensor to determine a height profile of the substrate W. The measurement device may be a sensor to determine a position of the substrate W relative to the substrate table WT holding the substrate W. In an embodiment, the lithographic apparatus comprises two measurement devices, wherein one measurement device is closer to the projection system PS than the other measurement device. One measurement device may perform a coarse measurement, whereas the other measurement device may perform a fine measurement. The lithographic apparatus may comprise two substrate tables WT and one further stage 300. The lithographic apparatus may be arranged to simultaneously have one of the two substrate tables WT near a first measurement device, the other of the two substrate tables WT at a second measurement device, and the further stage 300 at the projection system PS.

In an embodiment, there is provided a lithographic apparatus, comprising a substrate table having a holding surface for holding a substrate; a projection system for projecting an image on the substrate; an encoder system for providing a signal representative of a position of the substrate table; a measurement frame; a measurement system for measuring a property of the lithographic apparatus, wherein the holding surface is along a plane, wherein the projection system is at a first side of the plane, and wherein the measurement frame is arranged to support at least part of the encoder system and at least part of the measurement system at a second side of the plane different from the first side.

In an embodiment, the measurement system comprises a detector arranged on the measurement frame, wherein the detector is arranged to receive a radiation beam. In an embodiment, the lithographic apparatus comprises a mark, and wherein the projection system is arranged to provide the radiation beam via the mark onto the detector. In an embodiment, the lithographic apparatus comprises a support structure for supporting a patterning device, wherein one of the support structure and the patterning device has a patterning mark, wherein the projection system is arranged to project an image based on the patterning mark onto the mark. In an embodiment, the measurement system is arranged to determine an image quality of the projection system based on the radiation beam. In an embodiment, the mark is arranged on the substrate table. In an embodiment, the substrate table comprises an optical system arranged to propagate the radiation beam at least partly in a direction along the plane. In an embodiment, the lithographic apparatus comprises a further stage, wherein the further stage is arranged to be at the projection system when the substrate is away from the projection system, wherein the mark is arranged on the further stage. In an embodiment, the lithographic apparatus comprises a liquid supply system, wherein the liquid supply system is arranged to provide a liquid between the projection system and the substrate when the substrate is at the projection system, wherein the liquid supply system is arranged to provide the liquid between the projection system and the further stage when the substrate is away from the projection system. In an embodiment, the lithographic apparatus comprises a reference mark for providing a positional reference for the encoder system, wherein the detector is arranged to receive the radiation beam via the reference mark. In an embodiment, the encoder system comprises a scale arranged on the substrate table, wherein the reference mark is arranged on the scale. In an embodiment, the substrate has a surface provided with a substrate mark, wherein the detector is arranged to receive the radiation beam via the substrate mark. In an embodiment, the measurement system is arranged to determine a position of the substrate mark relative to a position of the mark. In an embodiment, the measurement system comprises a radiation source for providing the radiation beam, wherein the radiation source is arranged on the measurement frame. In an embodiment, the lithographic apparatus comprises a control system for controlling a position of the substrate table based on the signal and on an output from the measurement system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The descriptions above are intended to be illustrative, not limiting. Thus, it will be apparent to one skilled in the art that modifications may be made to the invention as described without departing from the scope of the claims set out below.

What is claimed:

1. A system for an apparatus, the apparatus comprising a movable table having a surface generally along a plane and a projection system configured to project a radiation beam onto a substrate, the projection system being at a first side of the plane, the system comprising:
    an encoder system configured to provide a signal representative of a position of the table;
    a non-encoder measurement system configured to measure a property of the apparatus using a mark arranged to be located in or on the movable table and below a top surface of the substrate; and
    at least a detector part of the encoder system and at least a detector part of the non-encoder measurement system both configured to be located at a second side of the plane different from the first side.

2. The system of claim 1, wherein the at least detector part of the non-encoder measurement system comprises a detector arranged to receive a radiation beam from the projection system.

3. The system of claim 1, further comprising an optical system arranged to receive a radiation beam from the projection system and direct the radiation beam away from an optical axis of the projection system, wherein the at least detector part of the non-encoder measurement system is arranged to receive the radiation beam away from the optical axis.

4. The system of claim 1, wherein the non-encoder measurement system comprises fluorescent material to change a wavelength of a radiation beam received from the projection system.

5. The system of claim 1, wherein the property comprises an intensity of a radiation beam received by the non-encoder measurement system.

6. The system of claim 1, wherein the property comprises a distribution of radiation along a cross-section of a radiation beam received by the non-encoder measurement system.

7. The system of claim 1, wherein the property comprises an optical aberration.

8. The system of claim 1, wherein the property comprises a position of a focal point of radiation.

9. The system of claim 1, further comprising a control system configured to control i) a position of a table and/or ii) a position, orientation or shape of an optical component in the projection system, based on the signal and an output of the non-encoder measurement system.

10. The system of claim 1, further comprising an additional measurement system arranged to determine a distance or a change in distance between the at least part of the non-encoder measurement system and the projection system.

11. The system of claim 1, further comprising a measurement device and a measurement frame near the measurement device, wherein the measurement frame is arranged to support at least part of a further encoder system at the second side of the plane.

12. The system of claim 11, wherein the measurement device is an alignment device to determine a position of an alignment mark or is a sensor to determine a height profile of the substrate.

13. The system of claim 11, further comprising two measurement devices, wherein one measurement device is closer to the projection system than the other measurement device.

14. A system for an apparatus, the apparatus comprising a movable table having a surface generally along a plane and a projection system configured to project a radiation beam onto a substrate, the projection system being at a first side of the plane, the system comprising:
    an encoder system configured to provide a signal representative of a position of the table;
    a non-encoder measurement system comprising at least a radiation output configured to output radiation onto the table or an object supported by the table, the measurement system configured to measure a property of the table or of an object supported by the table; and
    at least a detector part of the encoder system and at least the radiation output part of the non-encoder measurement system both configured to be located at a second side of the plane different from the first side.

15. The system of claim 14, wherein the non-encoder measurement system comprises a detector arranged to receive a radiation beam and at least part of the detector is configured to be located at the second side of the plane.

16. The system of claim 14, wherein the non-encoder measurement system is an alignment device to determine a position of an alignment mark.

17. The system of claim 14, further comprising a control system configured to control a position of a table based on the signal and an output of the non-encoder measurement system.

18. A system for an apparatus, the apparatus comprising a movable table having a surface generally along a plane and a projection system configured to project a radiation beam onto a substrate, the projection system being at a first side of the plane and the movable table is not configured hold the substrate, the system comprising:
    a displacement measurement system configured to provide a signal representative of a position of the table;
    a further measurement system configured to measure a property of the apparatus via the movable table, the property being other than a position of the movable table; and
    at least a detector part of the measurement system configured to be located at a second side of the plane different from the first side.

19. The system of claim 18, wherein the at least detector part of the further measurement system is configured to be attached to the projection system.

20. The system of claim 18, wherein the at least detector part of the further measurement system comprises a detector arranged to receive a radiation beam from the projection system.

* * * * *